(12) United States Patent
Callahan, Jr.

(10) Patent No.: US 6,208,187 B1
(45) Date of Patent: Mar. 27, 2001

(54) COMPARATOR CIRCUIT WITH BUILT-IN HYSTERESIS OFFSET

(75) Inventor: Michael J. Callahan, Jr., Austin, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 09/326,358

(22) Filed: Jun. 4, 1999

(51) Int. Cl.[7] .................................................. H03K 3/286
(52) U.S. Cl. ........................... 327/206; 327/205; 327/65; 327/67
(58) Field of Search .................................. 327/63, 65, 66, 327/67, 68, 69, 70, 74, 77, 205, 206, 207, 208; 330/252; 323/315, 316

(56) References Cited

U.S. PATENT DOCUMENTS

| | | | |
|---|---|---|---|
| 5,465,070 | * 11/1995 | Koyama et al. ........................ | 327/65 |
| 5,528,185 | * 6/1996 | Lewicki et al. ...................... | 327/206 |
| 5,587,674 | 12/1996 | Danstrom ............................... | 327/67 |
| 5,589,785 | * 12/1996 | Garavan ................................ | 327/563 |
| 5,656,957 | 8/1997 | Marlow et al. ........................ | 327/67 |
| 5,801,553 | 9/1998 | Danstrom ............................... | 327/67 |
| 5,955,899 | * 9/1999 | Afghahi ................................ | 327/65 |

\* cited by examiner

Primary Examiner—Timothy P. Callahan
Assistant Examiner—An T Luu
(74) Attorney, Agent, or Firm—Theodore E. Galanthay; Lisa K. Jorgenson; Michelle Larson

(57) ABSTRACT

A high-gain comparator has a built-in hysteresis offset voltage generation feature. The comparator is characterized as having several elements, including a differential amplifier pair that is provided with first and second input voltages, an offset voltage element that creates an offset voltage between the first and second elements of the differential amplifier pair, an output generation element operably coupled to the differential amplifier pair that generates an output voltage of the comparator which is indicative of a voltage difference between the first and second input voltages, and a control element operably coupled to the output signal that controllably adjusts the offset voltage from a first state to a second state in accordance with the output signal to create a hysteresis condition of the comparator.

36 Claims, 6 Drawing Sheets

COMPARATOR CIRCUIT WITH BUILT-IN HYSTERESIS OFFSET

BACKGROUND OF THE INVENTION

The present invention relates generally to electronic circuits used as comparators, and more specifically to electronic circuits used as comparators with built-in hysteresis.

The problem addressed by this invention is encountered in electronic circuits used to compare a first voltage to a second voltage. Commercially available comparators, such as the LM2904, are readily available and are often used to compare voltages. The LM2904 comparator is designed for no hysteresis and low offset. In some applications, such as a reset circuit, however, it is desirable for a comparator to have more hysteresis. FIG. 1 shows a prior art comparator, such as the LM2904, configured to have hysteresis. More specifically, FIG. 1 shows comparator 10 having a non-inverting input 4, an inverting input 12, and an output 8. Resistor 6 and resistor 3 add hysteresis to the circuit, as is known in the art. Typical resistor values for this configuration are 10 kilohms for resistor 3 and 1 Megohms for resistor 6. In fact, problems with the circuit of FIG. 1 are that large resistor values are required and/or the circuit has an undesirably low gain. Large resistor values are inconvenient for integration onto a chip.

FIG. 2a shows a prior art comparator circuit 16. This circuit includes a bias circuit 18, a differential input stage 20, and a hysteresis circuit 22. The bias circuit includes current source 24 connected in series with NPN bipolar transistor 26 and resistor 28. In operation, current is generated by current source 24 to forward bias transistor 26. This creates a bias voltage which is used by the transistors in the differential input stage 20 and by transistor 48 of comparator 16.

The differential stage includes PNP transistors 30, 36, 40, and 44, NPN transistors 32 and 46, resistors 38 and 42, and current source 34. In operation, the base of transistor 36 is the noninverting input of comparator 16 and the base of transistor 40 is the inverting input. When the base of transistor 36 is at a higher voltage than the base of transistor 40, transistor 40 turns on and conducts the current supplied by current source 34 while transistor 36 is off. Consequently, transistor 46 is turned off which allows transistor 44 to drive the voltage on Vout high. Conversely, if the base of transistor 36 is lower than the base of transistor 40, then transistor 36 is on and transistor 40 is off. This condition drives the emitter of transistor 46 low which turns transistor 46 on. Since transistor 46 is on, Vout is driven to a low voltage.

The hysteresis circuit 22 includes PNP transistor 48 and resistor 50. In operation, transistor 48 turns on when the V− input of the comparator is at a sufficiently low value to turn on transistors 30, 32 and 40. When the V− input goes positive with respect to the V+ input, transistor 36 conducts, turning off transistors 32, 30 and 48. With transistor 48 on, a voltage drop is developed across resistor 50. Therefore, this additional voltage drop is the hysteresis which must be overcome to switch the comparator when the voltage on the V− input rises.

The problem with the prior art of FIG. 2a is that the circuit requires resistors 38 and 42 to be relatively low resistance so that the circuit can have sufficient dynamic range without the transistors in the differential stage operating in saturation. Consequently, the circuit in FIG. 2a suffers from low gain.

FIG. 2b shows a circuit which is similar to FIG. 2a but differs in how the hysteresis in the circuit is achieved. FIG. 2b shows a bias current circuit comprising transistor M18, Q29, and resistor R40. The differential input stage comprises transistors Q0, Q1, Q2, Q3, Q4, and Q5. The output stage comprises M15 and M19. M13, M14, M15, M16, and M51 are current sources for the circuit. The base of Q2 is the non-inverting input and the base of Q0 is the inverting input of the differential stage. Resistors R26, R29, and R38 form a voltage divider to set up the voltage reference for the non-inverting input and to form the hysteresis circuit.

In operation, the output of the circuit, Vout, switches when the input, V−, rises to the threshold voltage of the circuit. At that point, Q0 and Q1 turn off while transistors Q3 and Q2 turn on. With Q3 on, M36 and M19 are turned on thereby activating the hysteresis circuit and pulling the output to a low voltage, respectively. The hysteresis circuit is activated by transistor M36 effectively shorting resistor R38 which effectively changes the voltage reference on the inverting input. The problem with this circuit is that current is always flowing in through the voltage divider network. Additionally, there is a practical problem with making transistor M36 large enough to completely short out the resistor R38 unless resistor R38 is made extremely large. If resistor R38 is large, then typically resistors R26 and R29 will have to be even larger and, for an integrated circuit, large circuit areas will be used.

SUMMARY OF THE INVENTION

It is an object of the present invention to provide a comparator characterized as having high gain.

It is further an object of this invention to provide a comparator which does not require a large resistor and, therefore, does not require a large area for the resistor on an integrated circuit.

Therefore, according to the present invention, a high-gain comparator having built-in offset comprises several functional blocks, including: a differential amplifier pair, an offset voltage element, an output generation element, and a control element. The differential amplifier pair has first and second elements, such as transistors, that receive first and second input voltages. The offset voltage element creates an offset voltage between the first and second elements of the differential amplifier pair. The output generation element is operably coupled to the differential amplifier pair and generates an output voltage of the comparator that is indicative of a voltage difference between the first and second input voltages. The control element is operably coupled to the output signal and controllably adjusts the offset voltage from a first state to a second state in accordance with the output signal to create a hysteresis condition of the comparator.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawing(s), wherein:

DESCRIPTION OF THE INVENTION

The high-gain comparator circuit of the present invention, as illustrated by the nine preferred embodiments that follow, has a built-in hysteresis offset voltage generation feature. According to a first class of embodiments, illustrated in FIGS. 3–7, offset generation circuitry has one or more resistive elements coupled to a source of current which may be controllably steered in first one direction, and then another direction. An offset voltage is created by this steered current and resistance and is reflected to the input as an equivalent input offset, which ultimately becomes the input hysteresis amount of the comparator. The resistive element (s) may be associated with the actual input transistors, or load transistors. A second class of embodiments, illustrated in FIGS. 8–10, the equivalent input offset voltage is created by controllably changing the area factors of one or more transistors in a differential amplifier. The change of area factor may be created by either a current steering circuit or through the use of switches, such as transmission gates. The change in area factor may be of one or more transistors, and may occur in the actual input transistors of the differential amplifier, or of the load transistors. According to a third class of embodiments, illustrated in FIGS. 11 and 12, the offset generation circuitry uses a combination of switches, such as transmission gates, and resistive elements coupled to a source of current to create the offset voltage. Finally, a fourth class of embodiments, illustrated in FIG. 13, creates an offset voltage by controllably steering a second source of current from one side to the other side of a differential amplifier. This unbalanced in current is translated into an input offset voltage through the transconductance of the input stage of the differential amplifier.

Regardless of the class of embodiments, the comparator of the present invention is characterized as having several elements, including a differential amplifier pair that is provided with first and second input voltages, an offset voltage element that creates an offset voltage between the first and second elements of the differential amplifier pair, an output generation element operably coupled to the differential amplifier pair that generates an output voltage of the comparator which is indicative of a voltage difference between the first and second input voltages, and a control element operably coupled to the output signal that controllably adjusts the offset voltage from a first state to a second state in accordance with the output signal to create a hysteresis condition of the comparator.

Figure 1:
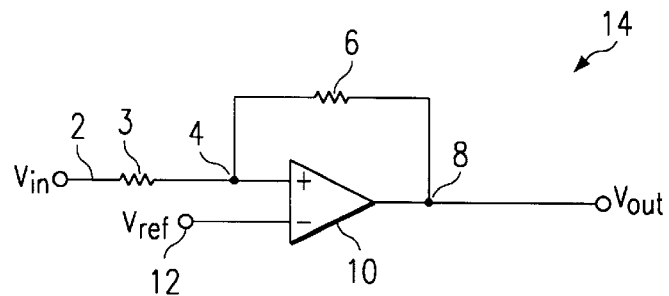
FIG. 1 is a block diagram of a comparator with hysteresis, according to the prior art.
Figure 2A:
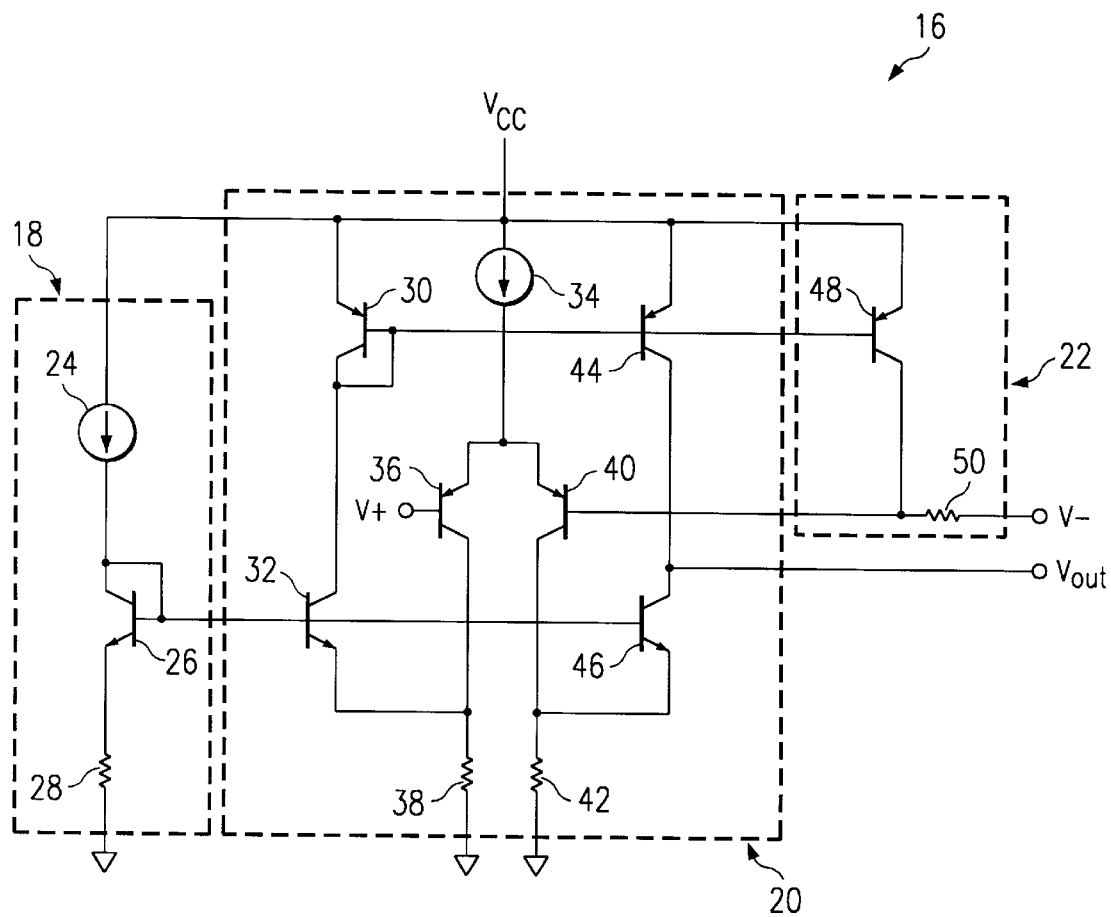
FIG. 2a is a schematic diagram of a comparator with internal hysteresis, according to the prior art.
Figure 2B:
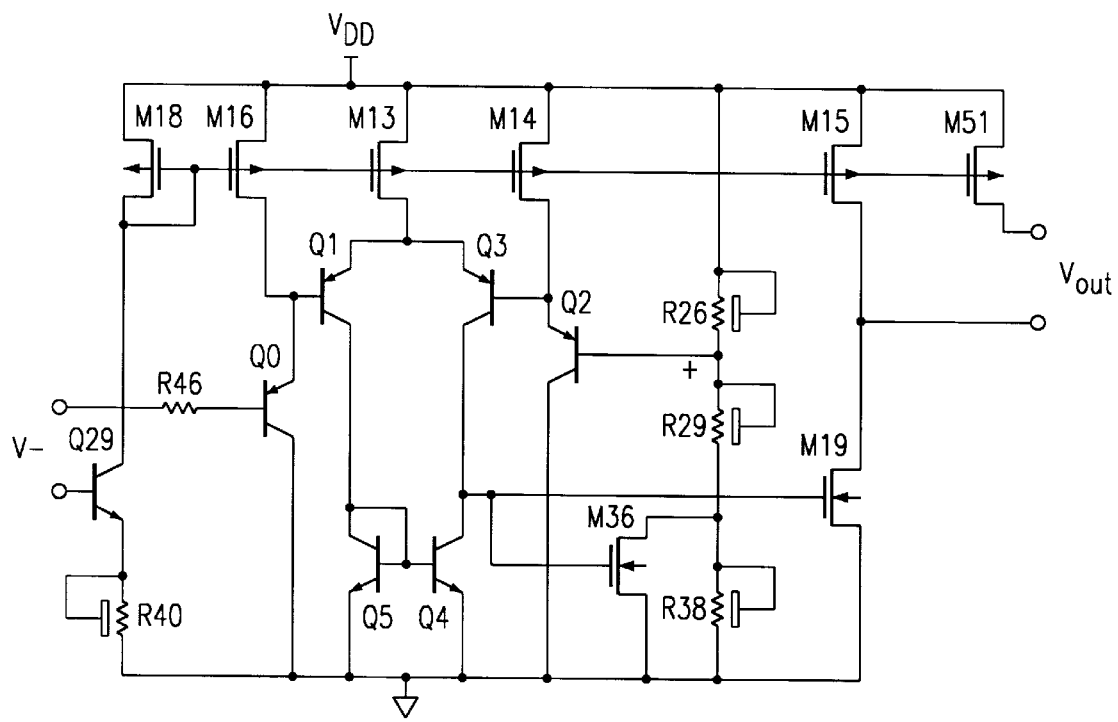
FIG. 2b is a schematic diagram of another comparator with internal hysteresis, according to the prior art.
Figure 3:
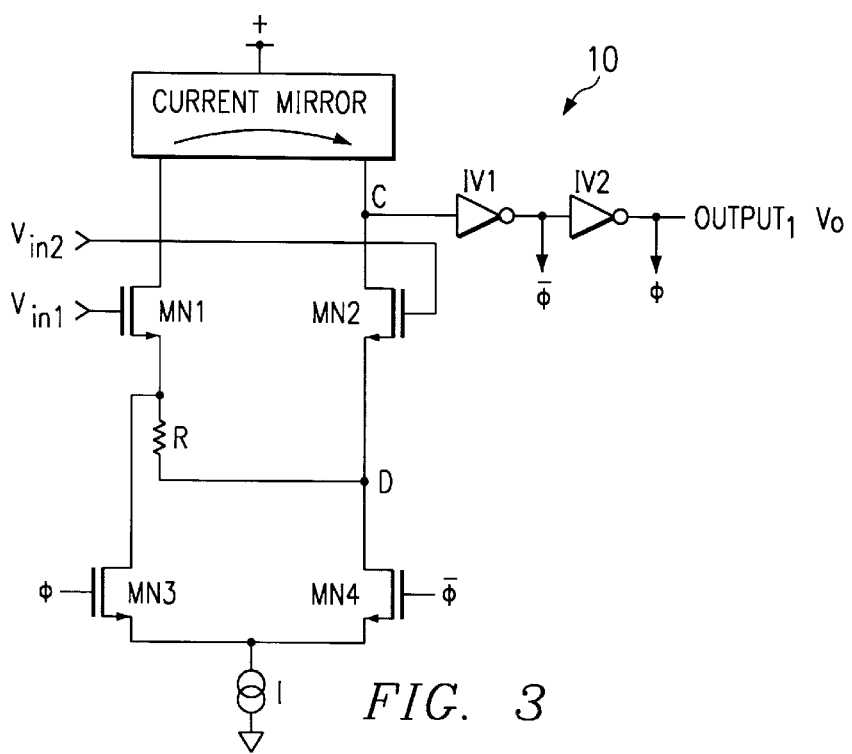
FIG. 3 is a schematic diagram of a high-gain comparator circuit, according to a first embodiment of the present invention.

The first group of embodiments, in which an offset generation circuitry has one or more resistive elements coupled to a current source to create an offset voltage by steered current and resistance, will now be described. Referring to FIG. 3, a first preferred embodiment of the present invention is shown. The comparator 10 of FIG. 3 comprises several elements, including a Current Mirror which is coupled to a power supply such as Vcc or Vdd, inverters IV1, IV2, a differential amplifier pair comprised of transistors MN1, MN2, a resistive element R which operates to create a hysteresis band about a reference voltage, a steering circuit comprised of transistors MN3, MN4, and current source I coupled to ground or Vss. Transistor MN1 of the differential amplifier pair receives a first input voltage VIN1 at its gate and transistor MN2 receives a second input voltage VIN2 at its gate. Transistors MN3 and MN4 together behave as a current steering circuit and current source I is coupled to differential amplifier pair MN1, MN2 via transistors MN3 and MN4 of the current steering circuit in accordance with control signals ø and øbar which control the gates of transistors MN3, MN4. MN1, MN2, MN3, and MN4 are shown as MOSFET transistors but one skilled in the art will recognize that the type of transistor used, whether MOS or bipolar, for instance, may vary without departing from the spirit and scope of the invention. It is further noted that if comparator 10 were composed of p-channel devices, rather than the n-channel devices shown, ø and øbar control signals would have to be inverted in order for the circuitry to properly operate. This observation also applies to the figures which follow.

The signal at node C of comparator 10 is inverted by inverter IV1 to generate control signal øbar which, in turn, is inverted by inverter IV2 to generate control signal ø, the output signal of comparator 10; it can thus be seen that control signals ø and øbar are out-of-phase signals in this embodiment. Since ø and øbar control the operation of the steering circuit, and since ø and øbar control signals are themselves signals derived from the signal at node C, it can be seen that the signal at node C, i.e. the output signal of comparator 10, effectively controls the operation of MN3, MN4 of the steering circuit. Thus, depending upon the logic state of the signal at node C, the current from current source I will be steered to either the source of differential amplifier transistor MN1 or the source of differential amplifier transistor MN2. And further, depending upon the logic state of the signal at node C, either a positive or a negative offset voltage is created at the inputs of the differential amplifier.

The balance condition of comparator circuit 10, determined by the point at which node C switches, is defined by that point at which the current in the drain of transistor MN2 just equals the current coming down from the current mirror, which in this embodiment is equal to the drain current of MN1. Thus, the input voltage conditions of comparator circuit 10 in the balance condition will either be:

$$VIN1+(I/2)*R=VIN2, \qquad (1)$$

or $$VIN1=VIN2+(I/2)*R \qquad (2)$$

and the total hysteresis, Vhys, of comparator circuit 10 is expressed as:

$$Vhys=I*R \qquad (3)$$

If VIN1 is coupled to a reference voltage, the hysteresis of comparator circuit 10 will be symmetrical about the reference voltage and may be expressed as Vhys-symmetrical:

$$Vhys\text{-symmetrical}=+/-(I/2)*R \qquad (4)$$

Figure 4A:
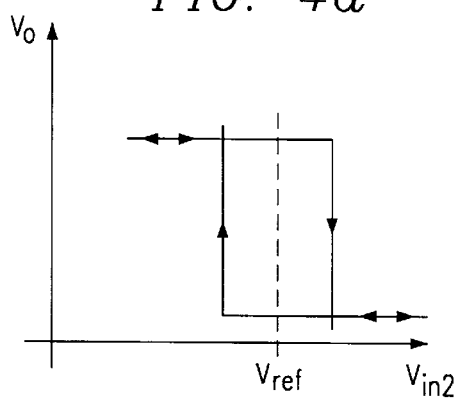
FIGS. 4a, 4b are graphs of the offset voltages of the hysteresis loop of the comparator circuit of FIG. 3, according to the first embodiment of the present invention.
Figure 4B:
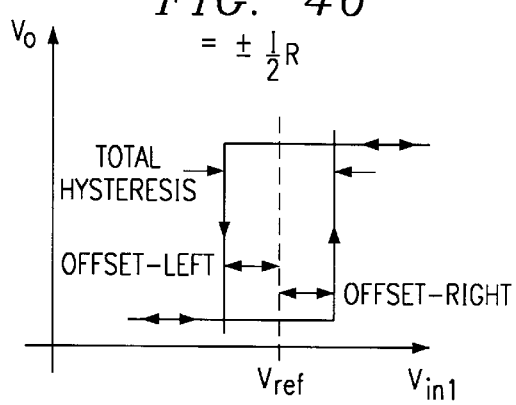

The graph of FIG. 4a illustrates the total hysteresis, symmetrical in nature, of FIG. 3. The total hysteresis is shown as being symmetrical about the voltage reference, Vref. This is further illustrated by the offset-left and offset-right, on either side of Vref, respectively, measuring the same magnitude of change in the VIN2 voltage. Similarly, the graph of FIG. 4b illustrates the symmetrical hysteresis of comparator circuit 10 when VIN2 voltage is coupled to a reference voltage, Vref. It may also be noted that the amount of offset-left is equal to the amount of offset-right, and does not depend upon any matching criteria, since each offset component is created by the same resistor and current source. An additional feature of this embodiment is that the amount of hysteresis is predictable, and is easily held to a predetermined value with zero temperature coefficient and no sensitivity to MOS process parameters. This may be accomplished by creating on the same chip a bandgap voltage reference source in known ways and then creating a bias current source that is equal to $V_{BG}/R1$, where $V_{BG}=V_{bandgap}$ and R1 is a resistor of convenient value. The current source I of FIG. 3 will be made to be related to the above-described bias current source, and the resistor R of FIG. 3 will be made of the same conductive material as resistor R1. Then by matching, the amount of hysteresis can be constructed to be a fraction of $V_{BG}$, which has therefore zero temperature coefficient, and does not depend upon any MOS process parameters such as mobility, threshold voltage, or gate oxide thickness.

Figure 5:
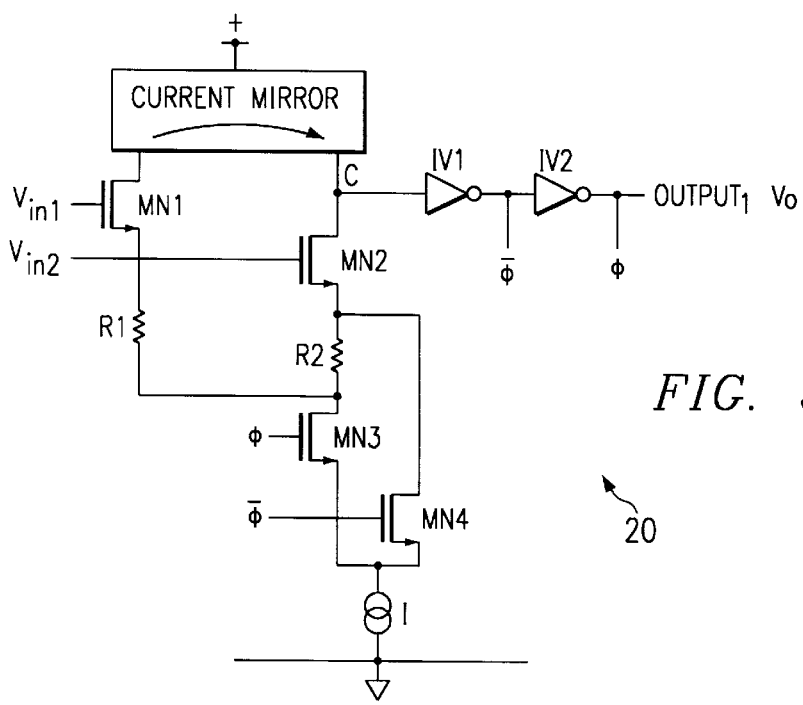
FIG. 5 is a schematic diagram of a high-gain comparator circuit, according to a second embodiment of the present invention.
Figure 6:
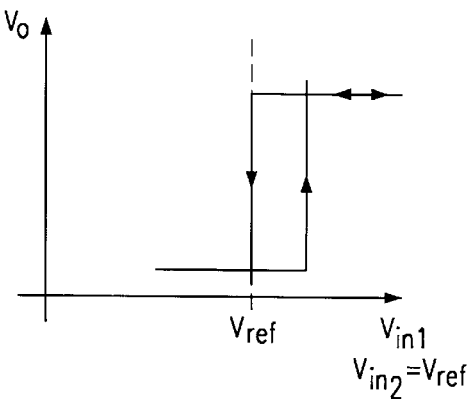
FIG. 6 is a graph of the offset voltage of the hysteresis loop of the comparator circuit of FIG. 5, according to the second embodiment of the present invention.

In addition to symmetrical hysteresis, it is possible to have asymmetrical hysteresis, such as a hysteresis band having just an offset-left or an offset-right component about the reference voltage Vref or a hysteresis band having offset-left and offset-right components that are unequal with respect to each other. An asymmetrical hysteresis band is quite attractive in those applications in which Vref is very accurate and is desired to switch the output Vo at the same voltage Vref, but still have hysteresis in order to be insensitive to noise. FIG. 5 illustrates a comparator circuit 20 having an asymmetrical hysteresis band about a reference voltage Vref and the graph of FIG. 6 illustrates the asymmetrical hysteresis band of the comparator circuit 20.

It can be seen that comparator circuit 20 of FIG. 5 has similar elements to those of comparator circuit 10 in FIG. 3, but has two resistors in the differential amplifier circuit of MN1 and MN2 instead of one resistor. Only one of the two resistors in this embodiment has current steered around it by the current steering circuit, thereby creating the asymmetrical hysteresis. The drains of transistors MN3 and MN4 are connected to transistors R1 and R2 in the manner shown. The source of transistor MN1 is coupled to a first terminal of resistor R1 and the source of transistor MN2 is coupled to a first terminal of resistor R2 and the drain of transistor MN4. The second terminals of resistors R1 and R2 are coupled to the drain of transistor MN3. Whether or not an asymmetrical offset voltage is produced about a reference voltage Vref to which the first input voltage VIN1 is connected is determined by whether transistor MN3 is conducting. When transistor MN3 is controlled by control signal ø to conduct and transistor MN4 is off, comparator circuit 20 may be considered balanced and no offset with respect to Vref exists, assuming that resistors R1 and R2, as well as other circuit elements, are designed to be balanced. When, however, transistor MN4 conducts and transistor MN3 is off, the total hysteresis of circuit 20 will be equal to:

$$Vhys=I*(R1+R2) \qquad (5)$$

This hysteresis will be a one-sided offset that is asymmetrical with respect to the reference voltage Vref. This one-sided offset voltage is shown as an offset-right voltage in FIG. 6, but it is understood that the offset voltage could just as easily be an offset-left voltage by simply changing the connection of the drain of transistor MN4 and swapping the control signals ø and ø bar that are provided to the gates of transistors MN3 and MN4, respectively.

Figure 7:
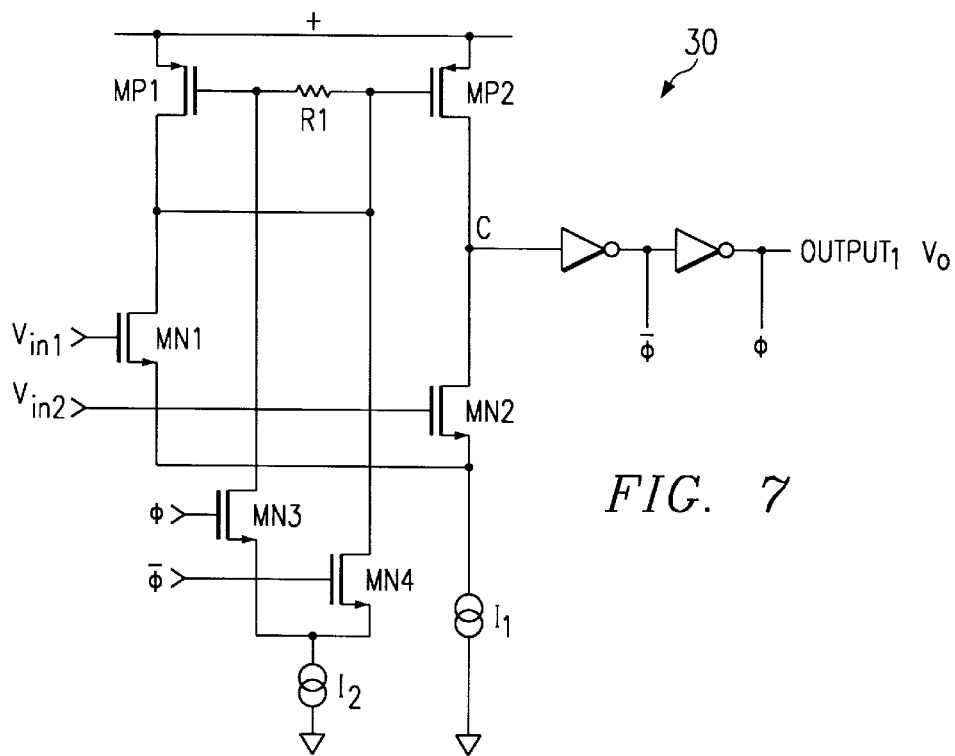
FIG. 7 is a schematic diagram of a high-gain comparator circuit, according to a third embodiment of the present invention.

The comparator circuit 30 of FIG. 7 differs from the previous embodiment in that it has two current sources I1 and I2 in which the I2 current is presumed to be less than the I1 current, I2<I1, and the current from current source I2 flows into the drain of transistor MP1 in either ø time (ø a high logic state, "1") or ø bar time (ø a low logic state, "0"). In ø time, transistor MN3 is on, transistor MN4 is off, and the current from current source I2 is steered through resistor R1 to transistor MP1. In øbar time, transistor MN3 is off, transistor MN4 is on, and the current from current source I2 is steered around resistor R1 to transistor MP1. Therefore, in ø time, an additional voltage drop is created across resistor R1, thereby adding to the offset. The larger the value of resistor R1, the greater the asymmetrical offset voltage. It may be noted that I2 always flows in MP1 regardless of output state.

Figure 8:
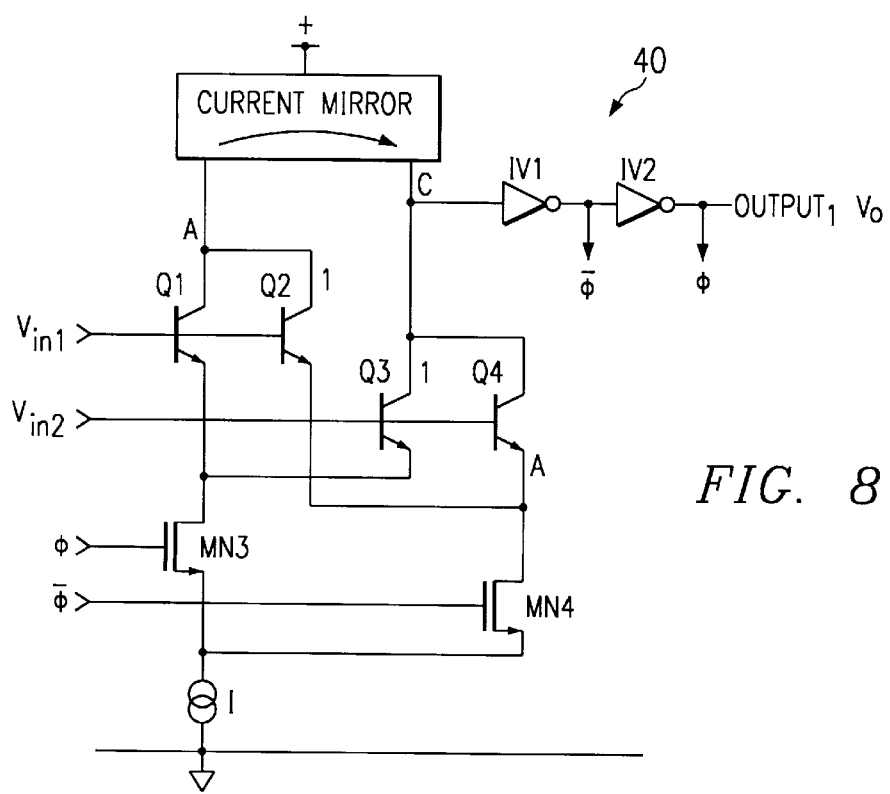
FIG. 8 is a schematic diagram of a high-gain comparator circuit, according to a fourth embodiment of the present invention.
Figure 9:
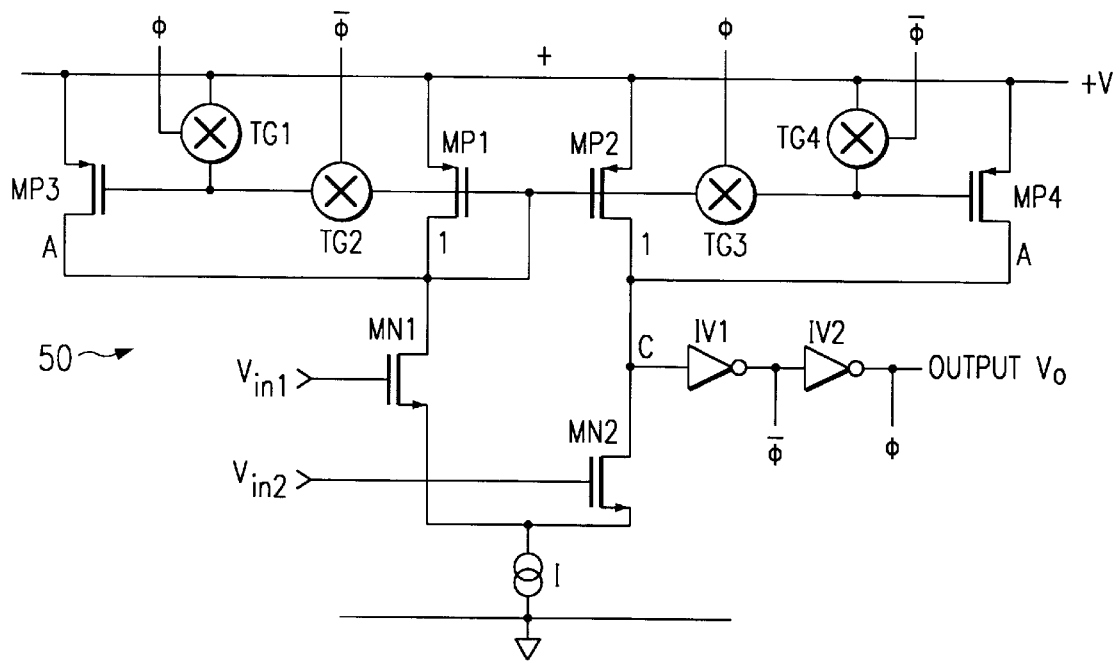
FIG. 9 is a schematic diagram of a high-gain comparator circuit, according to a fifth embodiment of the present invention.
Figure 10:
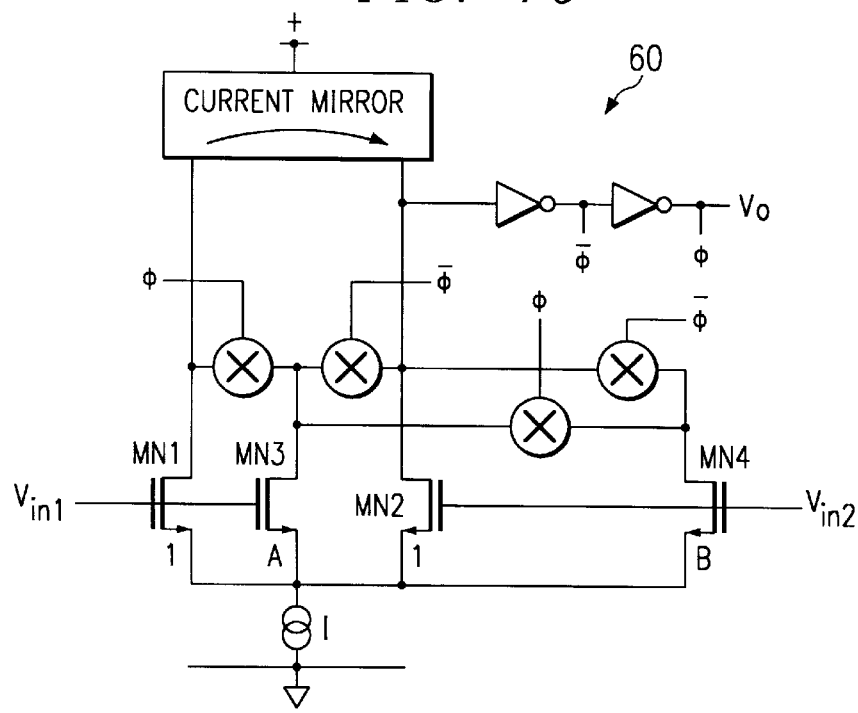
FIG. 10 is a schematic diagram of a high-gain comparator circuit, according to a sixth embodiment of the present invention.

In addition to the use of resistive elements as a means for generating a hysteresis band having a given offset voltage, sized transistors may be used to achieve the desired amount and type of offset voltage. The second class of embodiments creates an offset voltage by controllably changing the area factors of one or more transistors in a differential amplifier and are illustrated in FIGS. 8–10. Referring now to FIG. 8, comparator circuit 40 uses sized transistors Q1, Q2, Q3, and Q4 to achieve the desired hysteresis offset. Comparator circuit 40 includes a current mirror, inverters IV1, IV2, transistors MN3, MN4, and current source I in addition to sized transistors Q1, Q2, Q3, and Q4. In this embodiment, the differential input amplifier pair is either transistor pair Q1, Q3 or transistor pair Q2, Q4 and it is the sizing of these transistors relative to another that operates to generate an offset voltage with respect to a reference voltage Vref supplied to the circuit. Transistors MN3 and MN4 are controlled by control signals ø and ø bar to behave as a current steering circuit to steer current from current source I to transistors Q1–Q4.

Transistors Q1, Q2, Q3, Q4 may be sized as necessary to obtain a desired hysteresis band about voltage reference Vref supplied to either input voltage VIN1 or VIN2. The difference in sizing between the two transistors of a differential input amplifier pair provides the means for creating the offset voltage; in other words, it is the ratio of area factors of the differential amplifier pair that creates the offset. In a preferred embodiment, transistors Q1, Q2, Q3, Q4 are sized such that transistors Q2, Q3 have emitter area factors (in the case of bipolar transistors) equal to unity (1) and transistors Q1, Q4 have emitter area factors equal to A, wherein A>1. Then, as described above, depending upon the status of the signal at node C, and therefore the logic state of control signals ø and ø bar, the current from current source I is steered to the differential input amplifier pair Q1, Q3 or to differential input amplifier pair Q2, Q4. When transistor MN3 conducts and transistor MN4 is off, then the current from current source I is steered to differential amplifier pair Q1, Q3. Conversely, when transistor MN4 conducts and transistor MN3 is off, then the current is steered to differential amplifier pair Q2, Q4. Given that the sizing of transistors Q1–Q4 is as described above, with Q1 and Q4 having an area factor of A and Q2 and Q3 having an emitter area factor of unity, comparator circuit 30 has a hysteresis band that is symmetrical about Vref, with the symmetrical offset-left and offset-right voltages equal to:

$$\text{offset voltage} = +/-(kT/q)\ln(A) \text{ volts,} \qquad (6)$$

for the bipolar transistors Q1–Q4. This would, for example, be equal to +/−36 mV for A=4. It is understood that the offset voltage equation would change if bipolar transistors Q1–Q4 were replaced with MOSFET devices.

In addition to the transistor sizing discussed above, transistors Q2, Q3 may have area factors different from unity, and transistors Q1, Q4 may additionally have area factors different from each other. Sizing transistors Q1, Q4 to have different area factors would indicate that the offset-left and offset-right voltages of the hysteresis band about Vref would be asymmetrical. It is noted that in the embodiment of FIG. 8 the amount of offset is created by different current densities in the two transistors of the differential amplifier, and the current steering is used to switch between an unbalanced left or right circuit. In the embodiment shown in FIG. 8, the bipolar transistors create a small offset voltage which is predictable and reproducible from lot to lot, but has in this case a strong temperature coefficient. This circuit may be useful when the amount of the hysteresis need not be precisely controlled.

Referring now to FIG. 9, another embodiment in which transistor sizing, as opposed to resistive elements, is used to achieve built-in hysteresis is shown. Comparator circuit 50 differs from the previous comparator circuits in both layout and composition. In circuit 50 transmission gates, controlled by control signals ø and ø bar, create controlled offset voltages of a differential amplifier. Comparator circuit 50 includes the following elements: transistors MN1 and MN2 coupled directly to current source I, current source I coupled to Vss or ground potential; differential amplifier pair comprised of MOSFET transistors MN1, MN2 that are supplied with input voltages VIN1, VIN2, respectively; inverters IV1, IV2; MOSFET transistors MP1, MP2 that together comprise a current mirror; MOSFET transistors MP3, MP4; and transmission gates TG1, TG2, TG3, and TG4.

Again, similar to FIG. 8, the relative sizing of MP1 with respect to MP3 and the sizing of MP2 with respect to MP4 provides the means for creating an offset voltage of a hysteresis band produced by the circuit. However, the circuitry of FIG. 8 changes the size of the load transistors rather than the input transistors. Thus in this circuit, the imbalance is created in the load circuit rather than in the input circuit of the differential amplifier, and could occur in a conventional current mirror, Wilson current mirror, folded-cascode load, cross-coupled latch type load circuit, or other appropriate circuit structure. The amount of current imbalance in the load gets reflected back to the true input of the differential amplifier through the transconductance of the input stage. As shown in FIG. 9, transistors MP1, MP2 have area factors of unity while transistors MP3, MP4 have area factors of A, wherein A may be less than, equal to, or greater than unity, depending upon how much and what type of hysteresis is desired, such as symmetrical or asymmetrical, is desired.

When ø is true (a logic high state, "1"), control signals ø and øbar control transmission gates TG1–TG4 to cause transistor MP4 to be connected in circuit 40 and transistor MP3 to be disconnected from circuit 50. This causes a hysteresis offset determined by the size of transistors MP2+MP4 relative to the size of transistor MP1. Conversely, when øbar is true, control signals ø and øbar control transmission gates TG1–TG4 to leave transistor MP3 connected in circuit 50 and to disconnect transistor MP4 from the circuit, thereby causing a hysteresis offset that is determined by the size of transistors MP1+MP3 relative to the size to transistor MP2. It can thus been seen that control signals ø and øbar control the generation of symmetrical offset voltages, either offset-left or offset-right, with respect to a reference voltage Vref as might be coupled to VIN1 or VIN2. This generation of symmetrical offset voltages is provided with high gain and no resistors. Of course, it is understood that asymmetrical offset voltages with respect to Vref might be obtained by selectively varying the sizing of transistors MP1–MP4 with respect to each other in any desired manner, or by just using, for example, transistor MP3, and not using transistor MP4 at all. This has the effect of having an area factor A=0, for MP4.

Comparator circuit 60 of FIG. 10 is an embodiment of the present invention that, like FIG. 9, utilizes transistor sizing and transmission gates to yield an inherent offset voltage creation. During ø time when ø is a high logic state, transistor MN1 forms one input transistor of circuit 60 and transistor MN2 is augmented by transistors MN3, MN4 to create the other input transistor of area factor 1+A+B, assuming that transistors MN1, MN2 each have an area factor of unity, MN3 an area factor of A, and MN4 an area factor of B. Conversely, during ø bar time when a ø is a low logic state, transistor MN2 forms one input transistor of circuit 60 and transistor MN1 is augmented by transistors MN3, MN4, effectively creating the other input transistor having area factor of 1+A+B on the opposite side of the differential amplifier. Comparator circuit 60 is thus characterized as having symmetrical hysteresis offset voltages with respect to a reference voltage. Either factor A or B may be unity, zero, less than, or greater than unity.

Figure 11:
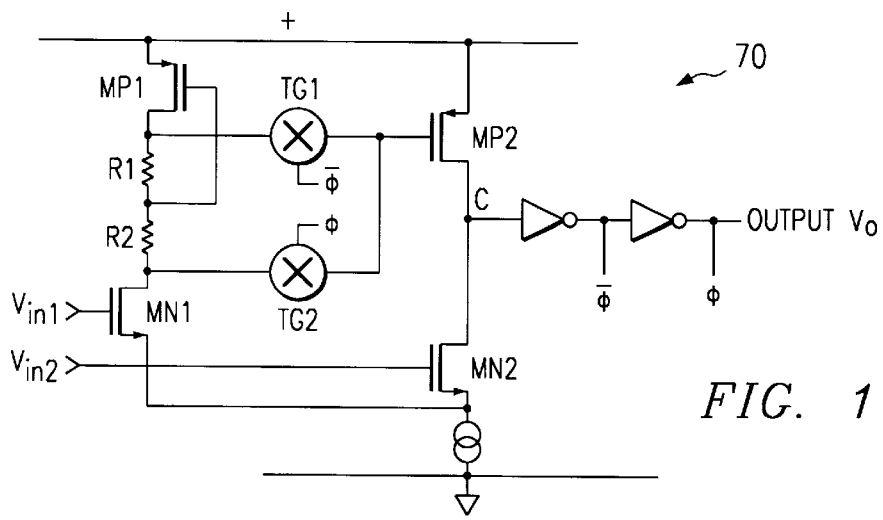
FIG. 11 is a schematic diagram of a high-gain comparator circuit, according to a seventh embodiment of the present invention.
Figure 12:
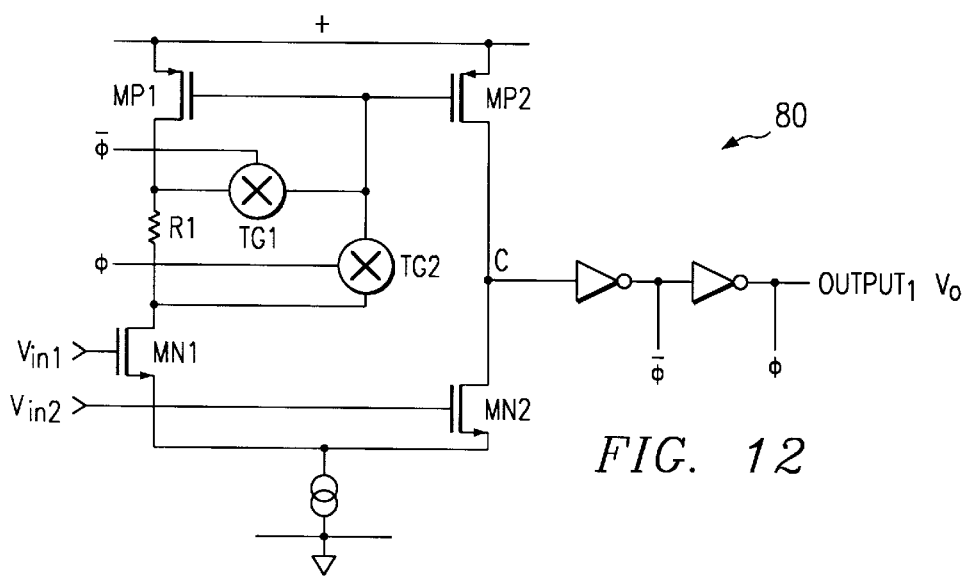
FIG. 12 is a schematic diagram of a high-gain comparator circuit, according to an eighth embodiment of the present invention.

According to a third class of embodiments, illustrated in FIGS. 11 and 12, the offset generation circuitry uses a combination of switches, such as transmission gates, and resistive elements coupled to a source of current to create the offset voltage. Referring now to FIG. 11, comparator circuit 70 uses a mixture of resistive elements and transmission gates, rather than the device sizing of FIGS. 8, 9 and 10, to achieve a built-in offset voltage. Differential amplifier pair MN1 and MN2 are provided with input voltages VIN1 and VIN2, such as might be coupled to a reference voltage Vref. Differential amplifier pair MN1, MN2 is coupled to current source I which is, in turn, coupled to ground or Vss potential as shown. Differential amplifier pair MN1, MN2 is also coupled to the rest of circuit 70 in the manner illustrated. The drain of transistor MN1 is coupled to resistor R2 and transmission gate TG2 while the drain of transistor MN2 is coupled to transistor MP2 and inverter IV1 at node C. Resistor R2 is additionally coupled to resistor R1 and the gate of transistor MP1 which is connected as a diode device. MP1 and R1 are coupled to transmission gate TG1, as is MP2 and transmission gate TG2. Transistors MP1 and MP2 are both coupled to Vcc or Vdd as shown. The signal at node C is inverted by inverter IV1 to generate control signal øbar which, in turn, is inverted by inverter IV2 to generate control signal ø, the output signal of comparator circuit 70. Control signals øbar and ø control transmission gates TG1 and TG2. As in FIG. 9, control signals ø and øbar control symmetrical offset about a reference voltage Vref supplied to MN1 or MN2 as VIN1 or VIN2, respectively.

The comparator circuit 80 of FIG. 12 is similar to FIG. 11 but is capable of producing an asymmetrical offset with respect to a Vref voltage reference provided as VIN1 or VIN2 to the differential amplifier pair MN1, MN2. Again, control signals øbar and ø control transmission gates TG1 and TG2, respectively, to determine which side of the differential amplifier pair is unbalanced. The logic state of ø and ø bar determine when offset creating resistor R1 is included in comparator circuit 80. Comparator circuit 80 is balanced in øbar time and unbalanced in ø time.

Figure 13:
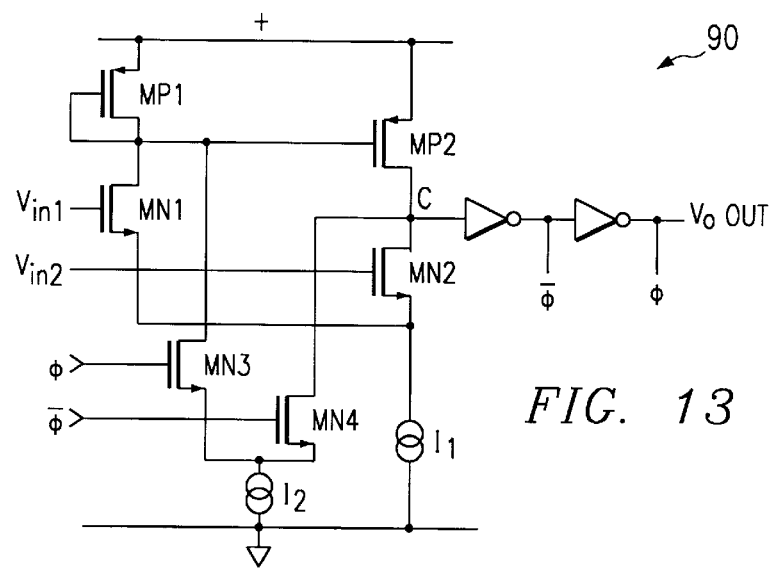
FIG. 13 is a schematic diagram of a high-gain comparator circuit, according to a ninth embodiment of the present invention.

The fourth class of embodiments create an offset voltage by controllably steering a second source of current from one side to the other side of a differential amplifier and is illustrated in FIG. 13. This unbalance in current is translated into an input offset voltage through the transconductance of the input stage of the differential amplifier. Referring now to the embodiment of FIG. 13, comparator circuit 90 again has two current sources, with I1 greater than I2. Differential amplifier pair MN1, NN2 is provided with VIN1, VIN2 input signals, respectively, one of which may be a reference voltage Vref. The current from current source I1 is provided to the drain of transistor MN2 and the current from current source I2 is selectively steered to the node of the gates of transistors MP1, MP2 or to node C by the steering circuit comprised of transistors MN3, MN4 which are controlled by control signals ø and ø bar, respectively. In comparator circuit 90 it is the current from current source I2 that creates the unbalance condition in the circuit as controlled by control signals ø and ø bar, and does not use any resistive elements.

The amount of hysteresis created by comparator circuit 90 is controlled by the sizing relationship between current sources I1, I2 and the sizing of transistors MN1, MN2, MP1, MP2. For instance, assuming that transistors MP1 and MP2 are equal in size and that transistors MN1, MN2 are also equal in size, a symmetrical offset voltage about Vref is created. Creating an imbalance in the sizing of MP1 with respect to MP2 or of MN1 with respect to MN2 would yield an asymmetrical offset voltage about Vref.

While the invention has been particularly shown and described with reference to a preferred embodiment, it will be understood by those skilled in the art that various changes in form and detail may be made therein without departing from the spirit and scope of the invention. It is hereby understood that any of the embodiments of FIGS. 3–13 may be implemented using either MOSFET or Bipolar transistors, or any desired combination thereof without departing from the spirit and scope of the invention. Additionally, the current sources shown could be replaced with resistive elements without departing from the spirit and scope of the invention. Moreover, most of the circuits described above as providing symmetrical offset creation may be modified in a straightforward manner to deliver a one-sided, asymmetrical hysteresis offset with respect to a reference voltage Vref.

What is claimed is:

1. A high-gain comparator having built-in offset, comprising:

a differential amplifier pair with a first element of the differential amplifier pair that receives a first input voltage and a second element of the differential amplifier pair that receives a second input voltage;

an offset voltage element that creates an offset voltage between the first and second elements of the differential amplifier pair;

an output generation element that generates an output voltage of the comparator that is indicative of a voltage difference between the first and second input voltages, the output generation element being operably coupled to the differential amplifier pair; and a control element operably coupled to the output voltage that controllably adjusts the offset voltage from a first state to a second state in accordance with the output voltage to create a hysteresis condition of the comparator.

2. The comparator of claim 1, wherein the offset voltage element comprises one or more resistive elements coupled to one or more sources of current capable of being controllably steered, and wherein the offset voltage is created by the steered current of the one or more sources of current and the one or more resistive elements and is reflected to the differential amplifier pair as an equivalent input offset as controlled by the control element.

3. The comparator of claim 2, wherein the offset voltage element comprises:

a resistive element operably coupled to the differential amplifier pair;

a steering circuit comprised of a first steering element and a second steering element coupled to the resistive element and to the differential amplifier pair; and a source of current of the one or more sources of current coupled to the steering circuit, wherein a current from the source of current is steered to the differential amplifier pair by the first and second steering elements of the steering circuit in accordance with the output voltage.

4. The comparator of claim 3, wherein the steering circuit comprises the first steering element coupled to the first element of the differential amplifier pair and controlled by a first control signal of one or more control signals and the steering second element coupled to the second element of the differential amplifier pair and controlled by a second control signal of the one or more control signals, and the resistive element is a resistor having a first terminal coupled to the first element of the differential amplifier pair and the first steering element of the steering circuit and having a second terminal coupled to the second element of the differential amplifier pair and the second steering element of the steering circuit.

5. The comparator of claim 3, wherein a hysteresis band of the comparator is symmetrical with respect to a voltage reference.

6. The comparator of claim 5, wherein an offset-left voltage of the hysteresis band is equal to an offset-right voltage of the hysteresis band.

7. The comparator of claim 2, wherein the offset voltage element comprises:

a first resistive element operably coupled to the differential amplifier pair;

a second resistive element operably coupled to the differential amplifier pair;

a steering circuit comprised of a first steering element and a second steering element, with at least one of said steering elements coupled to at least one of said resistive elements and to the differential amplifier pair; and a source of current coupled to the steering circuit, wherein a current from the source of current is steered around either the first resistive element or the second resistive element to the differential amplifier pair by the first steering and second steering elements of the steering circuit in accordance with the output voltage.

8. The comparator of claim 7, wherein a hysteresis band of the comparator is asymmetrical with respect to a voltage reference.

9. The comparator of claim 8, wherein an offset-left voltage of the hysteresis band is not equal to an offset-right voltage of the hysteresis band.

10. The comparator of claim 7, wherein the first terminal of the first resistive element is coupled to the first element of the differential amplifier pair, a second terminal of the first resistor is coupled to the first steering element of the steering circuit, a first terminal of the second resistive element is coupled to the second element of the differential amplifier pair and to the second steering element of the steering circuit, a second terminal of the second resistive element is coupled to the second terminal of the first resistive element and to the first steering element of the steering circuit, and the first and second steering elements are coupled to the source of current.

11. The comparator of claim 2, wherein the offset voltage element comprises:

a resistive element operably coupled to the differential amplifier pair and to a current mirror;

a steering circuit comprised of a first steering element and a second steering element coupled to the resistive element; and the source of current coupled to the steering circuit, wherein a current from the source of current is steered to the differential amplifier pair by the first and second steering elements of the steering circuit in accordance with the output voltage.

12. The comparator of claim 11, wherein the current mirror comprises:

a first transistor coupled to a first terminal of the resistive element and to the first element of the differential amplifier pair; and a second transistor coupled to a second terminal of the resistive element and to the second element of the differential amplifier pair.

13. The comparator of claim 2, wherein the first and second elements of the differential amplifier pair are coupled to a first current source element of the source of current, the offset voltage element comprises a resistive element coupled to a steering circuit, and wherein the steering circuit comprises:

a first steering element coupled to a power supply voltage and the first element of the differential amplifier pair and having a control terminal coupled to a first terminal of the resistive element;

a second steering element coupled to the power supply voltage, the second element of the differential amplifier pair, and the means for generating, and having a control terminal coupled to a second terminal of the resistive element;

a third steering element, having a control terminal controlled by a first control signal of the one or more control signals, a first terminal coupled to the first terminal of the resistive element, and a second terminal coupled to a second current source element of the source of current; and a fourth steering element, having a control terminal controlled by a second control signal of the one or more control signals, a first terminal coupled to the second terminal of the resistive element, and a second terminal coupled to the second current source element of the source of current, wherein when the first control signal is a first logic state, the third steering element is on, the fourth steering element is off, and current from the second current source element is steered to the first steering element and when the first control signal is a second logic state, the third element is off, the fourth element is on, and current from the second current source element is steered to the second steering element.

14. The comparator of claim 1, wherein the offset voltage element creates the offset voltage by controllably changing an area factor of one or more transistors.

15. The comparator of claim 14, wherein the comparator further comprises a second differential amplifier pair coupled to the differential amplifier pair, said second differential amplifier pair comprising:

a third element that receives the first input voltage; and a fourth element that receives the second input voltage;

and wherein the offset voltage element comprises:

a first steering element coupled to the source of current and controlled by a first control signal of the one or more control signals; and a second steering element coupled to the source of current and controlled by a second control signal of the one or more control signals, wherein the first element of the differential amplifier pair is coupled to the second element of the differential amplifier pair and the first steering element, the third element of the second differential amplifier pair is coupled to the first element of the differential amplifier pair, the fourth element of the second differential amplifier pair, and the second steering element, and the fourth element of the second differential amplifier pair is coupled to the second element of the differential amplifier pair, the third element of the second differential amplifier pair, and the second steering element, and wherein when the first control signal is a first logic state, the first steering element steers current from the source of current to the first and second elements of the differential amplifier pair and when the second control signal is the first logic state, the second steering element steers current from the source of current to the third and fourth elements of the second differential amplifier pair.

16. The comparator of claim 15, wherein the first element of the differential amplifier pair is sized to have an area factor A, the second element of the differential amplifier pair is sized to have an area factor of unity, the third element of the second differential amplifier pair is sized to have an area factor of unity, and the fourth element of the second differential amplifier pair is sized to have an area factor A, and wherein the difference between the area factor A of the first element and the area factor of unity of the second element defines the offset voltage of the differential amplifier pair and the difference between the area factor of unity of the third element and the area factor A of the fourth element defines an offset voltage of the second differential amplifier pair.

17. The comparator of claim 16, wherein the area factor A is greater than unity.

18. The comparator of claim 16, wherein the first and second elements of the differential amplifier pair are bipolar transistors, the third and fourth elements of the second differential amplifier pair are bipolar transistors, and the offset voltage is proportional to $+/-kT/q \ln(A)$.

19. The comparator of claim 15, wherein the output generation element comprises:
   a current mirror coupled to a power supply voltage and coupled to the differential amplifier pair; and
   a logic circuit that receives a signal at a node at which the current mirror is coupled to the second element of the differential amplifier pair, inverts the signal to generate the first control signal of the one or more control signals, and inverts the first control signal to generate the second control signal of the one or more control signals.

20. The comparator of claim 14, wherein the offset voltage element comprises:
   a current mirror coupled to the differential amplifier pair, a power supply voltage, and the differential amplifier pair;
   a first sizing element coupled to the current mirror and the power supply voltage;
   a second sizing element coupled to the current mirror and the power supply voltage;
   a first gating element, controlled by a first control signal of the one or more control signals, for selectively removing the first sizing element from the comparator when the first control signal is a first logic state; and
   a second gating element, controlled by the first control signal of the one or more control signals, for selectively removing the second sizing element from the comparator when the first control signal is a second logic state.

21. The comparator of claim 20, wherein the current mirror comprises:
   a first current mirror transistor coupled to the first gating element; and
   a second current mirror transistor coupled to the second gating element and having a gate coupled to the gate of the first current mirror transistor.

22. The comparator of claim 20, wherein when the first control signal is the first logic state, the offset voltage element is defined as an area factor of the first current mirror transistor compared to an area factor of the second current mirror transistor and an area factor of the second sizing element and when the first control signal is the second logic state, the offset voltage element is defined as the area factor of the second current mirror transistor compared to the area factor of the first current mirror transistor and an area factor of the first sizing element.

23. The comparator of claim 22, wherein the area factor of the first current mirror transistor is unity, the area factor of the second current mirror transistor is unity, the area factor of the first sizing element is A, and the area factor of the second sizing element is A.

24. The comparator of claim 1, wherein the offset voltage element further comprises a second differential amplifier pair coupled to the differential amplifier pair, said second differential amplifier pair comprising:
   a third element that receives the first input voltage and is coupled to the first element of the differential amplifier and the source of current; and
   a fourth element that receives the second input voltage and is coupled to the second element of the differential amplifier and the source of current;
   and wherein the steering circuit comprises:
   a first gating element, coupled to first element of the differential amplifier pair, the third element of the second differential amplifier pair, and a current mirror of the output generation element, that is controlled by a first control signal of the one or more control signals;
   a second gating element, coupled to the first gating element, the third element of the second differential amplifier, the current mirror, and the fourth element of the second differential amplifier, that is controlled by a second control signal of the one or more control signals;
   a third gating element, coupled to the second element of the differential amplifier pair, the third element of the second differential amplifier pair, the first and second gating elements, that is controlled by the first control signal; and
   a fourth gating element, coupled to the current mirror, the second and third gating elements, and the second element of the differential amplifier pair, that is controlled by the second control signal;
   wherein when the first control signal is a first logic state and the second control signal is a second logic state, the offset voltage is defined as the area factor of the first element of the differential amplifier pair, the area factor of the second amplifier of the differential amplifier pair, and the area factor of the third element of the second differential amplifier pair, and
   when the first control signal is the second logic state and the second control signal is the first logic state, the offset voltage is defined as the area factor of the second element of the differential pair and the third and fourth elements of the second differential amplifier pair.

25. The comparator of claim 24, wherein the first element of the differential amplifier pair is sized to have an area factor of unity, the second element of the differential amplifier pair is sized to have an area factor of B, the third element of the second differential amplifier pair is sized to have an area factor of B, and the fourth element of the second differential amplifier pair is sized to have an area factor of unity, and
   wherein the difference between the area factor of unity of the first element and the area factor of B of the second element defines the offset voltage of the differential amplifier pair and the difference between the area factor of A of the third element and the area factor of unity of the fourth element defines an offset voltage of the second differential amplifier pair.

26. The comparator of claim 25, wherein the area factor A and the area factor B are greater than unity.

27. The comparator of claim 1, wherein the offset voltage element comprises a first resistive element and a second resistive element coupled to the differential amplifier pair and to a steering circuit, and
   wherein the steering circuit comprises:
   a first steering element coupled to a power supply voltage;
   a second steering element coupled to the power supply voltage;
   a first gating means controlled by a first control signal of the one or more control signals; and
   a second gating means controlled by a second control signal of the one or more control signals;

wherein a first terminal of the first resistive element is coupled to the first steering element and the first gating means, a second terminal of the first resistive element is coupled to a control terminal of the first steering element and a first terminal of the second resistive element, a second terminal of the second resistive element is coupled to the first element of the differential amplifier pair and the second gating means, the second steering element is coupled to the second element of the differential amplifier pair and the means for generating the output voltage, and wherein when the first control signal is a first logic state, the first gating means and the second gating means cause the offset voltage to be determined by the first resistive element and when the first control signal is a second logic state, the first gating means and the second gating means cause the offset voltage to be determined by at least one of the first resistive element or the second resistive element.

28. The comparator of claim 1, wherein the offset voltage element comprises a resistive element coupled to the differential amplifier pair and to a circuit; and wherein the circuit comprises:
   a first element coupled to a power supply voltage and to a first terminal of the resistive element;
   a second element coupled to the power supply voltage, the second element of the differential amplifier pair, and the means for generating, wherein a control terminal of the second element is coupled to a control terminal of the first element;
   a first gating element, controlled by a first control signal of the one or more control signals, coupled to the control terminals of the first and second elements and to the first terminal of the resistive element; and
   a second gating element, controlled by a second control signal of the one or more control signals, coupled to the control terminals of the first and second elements, a second terminal of the resistive element, and the first element of the differential amplifier pair, wherein when the first control signal is a first logic state, the first gating element and the second gating element operate to define the offset voltage.

29. The comparator of claim 1, wherein the first and second elements of the differential amplifier pair are coupled to a first current source element of the source of current and wherein a steering circuit of the offset voltage element comprises:
   a first steering element coupled to the first element of the differential amplifier pair and having a control terminal;
   a second steering element coupled to the second element of the differential amplifier pair, and the means for generating, and having a control terminal coupled to the control terminal of the first steering element;
   a third steering element, having a control terminal controlled by a first control signal of the one or more control signals, a first terminal coupled to the control terminals of the first and second steering elements and to the first element of the differential amplifier pair, and a second terminal coupled to a second current source element of the source of current; and
   a fourth steering element, having a control terminal controlled by a second control signal of the one or more control signals, a first terminal coupled to the second steering element, the means for generating, and the second element of the differential amplifier pair, and a second terminal coupled to the second current source element of the source of current, wherein when the first control signal is a first logic state, the third steering element is on, the fourth steering element is off, and current from the second current source element is steered to the first and second steering elements and when the first control signal is a second logic state, the third element is off, the fourth element is on, and current from the second current source element is steered to a node to which the second steering element, the means for generating, and the second element of the differential amplifier pair is coupled.

30. The comparator of claim 1, wherein the output generation element comprises:
   a current mirror coupled to a power supply voltage and coupled to the differential amplifier pair; and
   a logic circuit that receives the output voltage of the comparator at a node at which the current mirror is coupled to the second element of the differential amplifier pair, inverts the output voltage to generate a first control signal of one or more control signals, and inverts the first control signal to generate a second control signal of the one or more control signals.

31. The comparator of claim 30, wherein the second control signal of the one or more control signals is an inverted and delayed version of the first control signal.

32. A method for creating a hysteresis condition of a high-gain comparator, comprising the steps of:
   providing a first input voltage to a first element of a differential amplifier pair and a second input voltage to a second element of the differential amplifier pair;
   creating an offset voltage between the first and second elements of the differential amplifier pair;
   generating an output voltage of the comparator that is indicative of a voltage difference between the first and second input voltages; and
   controllably adjusting the offset voltage from a first state to a second state in accordance with the output voltage to create the hysteresis condition of the comparator.

33. The method of claim 32, wherein the step of creating the offset voltage is performed by an offset voltage element comprising one or more resistive elements coupled to one or more sources of current capable of being controllably steered and wherein the steered current of a source of current of the sources of current and the one or more resistive elements create the offset voltage and reflect the offset voltage to the differential amplifier pair as an equivalent input offset.

34. The method of claim 33, wherein a current from the source of current is steered to the differential amplifier pair by the first and second steering elements of the steering circuit in accordance with the output voltage.

35. The method of claim 33, wherein the steered current is steered around either a first resistive element or a second resistive element of a offset voltage element to the differential amplifier pair by a first steering element and a second steering element of the steering circuit in accordance with the output voltage.

36. The method of claim 32, wherein the step of creating the offset voltage is performed by controllably changing an area factor of one or more transistors of the comparator.

* * * * *